(12) United States Patent
Tong et al.

(10) Patent No.: US 9,917,372 B2
(45) Date of Patent: Mar. 13, 2018

(54) INTEGRATED CIRCUIT PACKAGE WITH RADIO FREQUENCY COUPLING ARRANGEMENT

(71) Applicants: Ziqiang Tong, Munich (DE); Ralf Reuter, Munich (DE)

(72) Inventors: Ziqiang Tong, Munich (DE); Ralf Reuter, Munich (DE)

(73) Assignee: NXP USA, Inc., Austin, TX (US)

( * ) Notice: Subject to any disclaimer, the term of this patent is extended or adjusted under 35 U.S.C. 154(b) by 100 days.

(21) Appl. No.: 14/303,707

(22) Filed: Jun. 13, 2014

(65) Prior Publication Data
US 2015/0364829 A1 Dec. 17, 2015

(51) Int. Cl.
| | | |
|---|---|---|
| *H01Q 19/00* | (2006.01) | |
| *H01Q 19/10* | (2006.01) | |
| *G01S 13/02* | (2006.01) | |
| *G01S 7/03* | (2006.01) | |
| *G01S 13/08* | (2006.01) | |
| *H01Q 9/04* | (2006.01) | |
| *H01Q 23/00* | (2006.01) | |
| *G01S 13/93* | (2006.01) | |
| *G01S 7/02* | (2006.01) | |
| *H01P 5/107* | (2006.01) | |

(52) U.S. Cl.
CPC .............. *H01Q 19/10* (2013.01); *G01S 7/03* (2013.01); *G01S 13/02* (2013.01); *G01S 13/08* (2013.01);
(Continued)

(58) Field of Classification Search
CPC ...... H01Q 19/10; H01Q 19/185; H01L 31/12; G01S 13/02
(Continued)

(56) References Cited

U.S. PATENT DOCUMENTS

| | | |
|---|---|---|
| 2,897,409 A | 7/1959 | Gitto |
| 3,417,393 A | 12/1968 | Cooke |

(Continued)

FOREIGN PATENT DOCUMENTS

| | | |
|---|---|---|
| EP | 1367668 A1 | 12/2003 |
| EP | 1923950 A1 | 5/2008 |

(Continued)

OTHER PUBLICATIONS

Do-Hoon, K. et al., "A Wideband Vertical Transition Between Co-Planar Waveguide and Parallel-Strip Transmission," IEEE Microwave and Wireless Components Letters, vol. 15, No. 9, Sep. 2005, pp. 591-593.

(Continued)

*Primary Examiner* — Dieu H Dong
*Assistant Examiner* — Bamidele A Jegede
(74) *Attorney, Agent, or Firm* — Charlene R. Jacobsen

(57) ABSTRACT

An integrated circuit package comprises a dielectric material, a first stack comprising at least a first electrically isolating layer and a second electrically isolating layer arranged at a first side of the integrated circuit package, an electrically conductive material arranged on a second side opposed to the first side, and an integrated antenna structure for transmitting and/or receiving a radio frequency signal arranged between the first and second electrically isolating layers. The electrically conductive material is separated from the integrated antenna structure by at least the dielectric material and the first electrically isolating layer, arranged to partly overlap the integrated antenna structure and to reflect the radio frequency signal received by the electrically conductive material through at least the first electrically isolating layer and the dielectric material to the first side.

18 Claims, 8 Drawing Sheets

(52) U.S. Cl.
CPC ........... *H01Q 9/0407* (2013.01); *H01Q 23/00* (2013.01); *G01S 13/931* (2013.01); *G01S 2007/028* (2013.01); *H01L 2223/6677* (2013.01); *H01L 2224/16227* (2013.01); *H01L 2224/16235* (2013.01); *H01L 2225/1023* (2013.01); *H01L 2225/1041* (2013.01); *H01L 2225/1058* (2013.01); *H01P 5/107* (2013.01)

(58) Field of Classification Search
USPC ...................... 342/175; 343/834, 836; 438/27
See application file for complete search history.

(56) References Cited

U.S. PATENT DOCUMENTS

| | | | |
|---|---|---|---|
| 4,737,395 A | 4/1988 | Mabuchi | |
| 4,775,611 A | 10/1988 | Sullivan | |
| 4,861,640 A | 8/1989 | Gurol | |
| 5,374,788 A | 12/1994 | Endoh | |
| 5,490,965 A | 2/1996 | Christiansen | |
| 5,619,791 A | 4/1997 | Lambrecht, Jr. | |
| 6,081,241 A | 6/2000 | Josefsson | |
| 6,083,340 A | 6/2000 | Nomura | |
| 6,207,221 B1 | 3/2001 | Schulz-Harder | |
| 6,563,712 B2* | 5/2003 | Akram | H01L 23/3121 165/185 |
| 6,686,649 B1 | 2/2004 | Mathews et al. | |
| 6,713,685 B1 | 3/2004 | Cotton | |
| 6,740,576 B1 | 5/2004 | Lin | |
| 6,982,674 B2 | 1/2006 | Matsubara et al. | |
| 7,126,541 B2 | 10/2006 | Mohamadi | |
| 7,126,542 B2 | 10/2006 | Mohamadi | |
| 7,129,567 B2 | 10/2006 | Kirby | |
| 7,435,911 B2 | 10/2008 | Kim | |
| 7,468,894 B2 | 12/2008 | Bibee | |
| 7,728,774 B2* | 6/2010 | Akkermans | H01L 23/66 343/700 MS |
| 7,755,174 B2 | 7/2010 | Rollin et al. | |
| 7,767,913 B2 | 8/2010 | Corisis | |
| 7,808,439 B2 | 10/2010 | Yang et al. | |
| 7,868,257 B2 | 1/2011 | Kushta et al. | |
| 7,886,421 B2 | 2/2011 | Hwan | |
| 7,999,753 B2* | 8/2011 | Gaucher | H01Q 1/38 343/828 |
| 8,013,257 B2 | 9/2011 | Furuya | |
| 8,031,474 B2 | 10/2011 | Ogawa et al. | |
| 8,169,060 B2 | 5/2012 | Maurer et al. | |
| 8,199,060 B2 | 6/2012 | Rofougaran | |
| 8,242,384 B2 | 8/2012 | Cases et al. | |
| 8,283,764 B2 | 10/2012 | Tang | |
| 8,305,280 B2 | 11/2012 | Brown et al. | |
| 8,460,967 B2* | 6/2013 | Lachner | H01Q 1/2283 257/E21.499 |
| 8,497,804 B2 | 6/2013 | Haubrich | |
| 8,633,858 B2 | 1/2014 | Nair | |
| 8,860,532 B2 | 10/2014 | Gong et al. | |
| 9,444,135 B2 | 9/2016 | Tong et al. | |
| 9,615,447 B2 | 4/2017 | Hurwitz | |
| 2002/0191380 A1 | 12/2002 | Val | |
| 2003/0080836 A1 | 5/2003 | Nagaishi | |
| 2003/0100197 A1 | 5/2003 | Veitschegger | |
| 2003/0141348 A1 | 7/2003 | Tsay | |
| 2004/0118600 A1 | 6/2004 | Lee | |
| 2005/0000816 A1 | 1/2005 | Lin | |
| 2005/0069277 A1 | 3/2005 | Nakazawa | |
| 2005/0224989 A1 | 10/2005 | Myers | |
| 2006/0097906 A1 | 5/2006 | Heide | |
| 2006/0131729 A1 | 6/2006 | Lee | |
| 2006/0144617 A1 | 7/2006 | Kim | |
| 2006/0204652 A1 | 9/2006 | Meier | |
| 2007/0013581 A1 | 1/2007 | Iijima | |
| 2007/0017697 A1 | 1/2007 | Hsu | |
| 2007/0080864 A1 | 4/2007 | Channabasappa | |
| 2007/0211403 A1 | 9/2007 | Sievenpiper | |
| 2007/0221405 A1 | 9/2007 | Cheng | |
| 2008/0007927 A1 | 1/2008 | Ito | |
| 2008/0042248 A1 | 2/2008 | Nalla | |
| 2008/0060194 A1 | 3/2008 | Liao | |
| 2008/0079118 A1 | 4/2008 | Bang | |
| 2008/0180878 A1 | 7/2008 | Kim | |
| 2008/0197469 A1* | 8/2008 | Yang | H01L 25/0652 257/686 |
| 2008/0272964 A1* | 11/2008 | Su | H01Q 1/243 343/702 |
| 2008/0297283 A1 | 12/2008 | Byun | |
| 2009/0015485 A1 | 1/2009 | Floyd | |
| 2009/0057912 A1 | 3/2009 | Kheng | |
| 2009/0207080 A1* | 8/2009 | Floyd | H01Q 1/38 343/700 MS |
| 2009/0256752 A1* | 10/2009 | Akkermans | G06K 19/07749 343/700 MS |
| 2010/0001906 A1* | 1/2010 | Akkermans | H01L 23/66 343/700 MS |
| 2010/0103024 A1* | 4/2010 | Schultheiss | G01F 23/284 342/124 |
| 2010/0193935 A1* | 8/2010 | Lachner | H01Q 1/2283 257/693 |
| 2010/0206617 A1 | 8/2010 | Corisis | |
| 2010/0245155 A1 | 9/2010 | Miyazato | |
| 2011/0057743 A1 | 3/2011 | Shimura | |
| 2011/0234472 A1* | 9/2011 | Maurer | H01L 23/66 343/904 |
| 2012/0013499 A1 | 1/2012 | Hayata | |
| 2012/0086114 A1* | 4/2012 | Zhao | H01L 23/48 257/692 |
| 2012/0104574 A1* | 5/2012 | Boeck | H01L 23/49816 257/660 |
| 2012/0111726 A1 | 5/2012 | Couto Petri | |
| 2012/0119969 A1* | 5/2012 | MacDonald | H01L 23/552 343/841 |
| 2012/0128291 A1* | 5/2012 | Teitelbaum | G02B 6/4214 385/14 |
| 2012/0182066 A1 | 7/2012 | Merkle | |
| 2012/0188138 A1* | 7/2012 | Liu | H01Q 1/2283 343/776 |
| 2012/0256795 A1 | 10/2012 | Tajima | |
| 2012/0274419 A1 | 11/2012 | Lee et al. | |
| 2013/0012145 A1 | 1/2013 | Shibuya | |
| 2013/0021208 A1* | 1/2013 | Seok | H01Q 7/00 343/700 MS |
| 2013/0050016 A1 | 2/2013 | Kim | |
| 2013/0074332 A1 | 3/2013 | Suzuki | |
| 2013/0171752 A1 | 7/2013 | Val | |
| 2013/0207274 A1 | 8/2013 | Liu | |
| 2013/0256850 A1 | 10/2013 | Danny | |
| 2014/0262448 A1 | 9/2014 | Kato | |
| 2014/0300521 A1* | 10/2014 | Junemann | H01Q 1/38 343/770 |
| 2015/0181693 A1 | 6/2015 | Wu | |
| 2015/0346322 A1 | 12/2015 | Schmalenberg | |
| 2015/0364829 A1 | 12/2015 | Tong | |
| 2015/0364830 A1 | 12/2015 | Tong | |
| 2015/0382469 A1 | 12/2015 | Hu | |

FOREIGN PATENT DOCUMENTS

| | | |
|---|---|---|
| EP | 2500978 B1 | 7/2013 |
| WO | 2012140422 A2 | 10/2012 |

OTHER PUBLICATIONS

U.S. Appl. No. 14/473,038, filed Aug. 29, 2014, entitled "Radio Frequency Coupling Structure and a Method of Manufacturing Thereof".

Alleaume, P.F., et al., "Millimeter-wave SMT Low Cost Plastic Packages for Automotive RADAR at 77GHz and High Data Rate E-band Radios," 2009 IEEE MTT-S International Microwave Symposium Digest (IMS), Jun. 7-12, 2009; pp. 789-792.

Deslandes, Dominic, "Design Equations for Tapered Microstrip-to-Substrate Integrated Waveguide Transitions," 2010 IEEE MTT-S

(56) References Cited

OTHER PUBLICATIONS

International Microwave Symposium Digest (MTT); May 23-28, 2019, pp. 704-707.

Glogowski, R. et al., "Double Resonance Transition from Rectangular Waveguide to Substrate Integrated Waveguide," 2013 IEEE 7th European Conference on Antennas and Propagation (EuCAP); Apr. 8-12, 2013; pp. 3353-3354.

Henawy, M.A., et al., "Integrated Antennas in eWLB Packages for 77 GHz and 79 GHz Automotive Radar Sensors," Proceedings of the 8th European Radar Conference; Oct. 12-14, 2011, Manchester, UK; pp. 424-427.

Keser, B. et al., "The Redistributed Chip Package: A Breakthrough for Advanced Packaging," Proceedings of the 57th IEEE Electronic Components and Technology Conference, 2007; May 29, 2007-Jun. 1, 2007; pp. 286-291.

Lamy, Y. et al., "mmW Characterization of Wafer Level Passivation for 3D Silicon Interposer," 2013 IEEE 63rd Electronic Components & Technology Conference; May 28-31, 2013; pp. 1187-1981.

Pohl, N. et al., "An UWB 80GHz FMCW Radar System Using a SiGe Bipolar Transceiver Chip Stabilized by a Fractional-N PII Synthesizer," IEEE Transactions on Microwave Theory and Techniques, vol. 60, No. 3, Mar. 2012, pp. 757-765.

Schmid, C.M. et al., "A 77-GHz FMCW Radar Transceiver MMIC / Waveguide Integration Approach," 2013 IEEE MTT-S International Microwave Symposium Digest (IMS); Jun. 2-7, 2013; pp. 1-4.

Trotta, S. et al., "An RCP Packaged Transceiver Chipset for Automotive LRR and SRR Systems in SiGe BiCMOS Technology," IEEE Transactions on Microwave Theory and Techniques, vol. 60, No. 3, Mar. 2012, pp. 778-794.

U.S. Appl. No. 14/303,705, filed Jun. 13, 2014, entitled "Radio Frequency Coupling Structure".

U.S. Appl. No. 14/303,713, filed Jun. 13, 2014, entitled "Integrated Circuit Package with Radio Frequency Coupling Structure".

Fischer, A. et al., "A 77-GHz antenna and fully integrated radar transceiver in package," International Journal of Microwave and Wireless Technologies 2012; vol. 4, issue 4; Aug. 2012; 7 pages.

Fischer, A. et al., "A 77-GHz Antenna in Package," 2011 IEEE 41st European Microwave Conference, Oct. 10-13, 2011; pp. 1316-1319.

Wojnowski, M. et al., "A 77-GHz SiGe Single-Chip Four-Channel Transceiver Module with Integrated Antennas in Embedded Wafer-Level BGA Package," IEEE 62nd Electronic Components and Technology Conference; May 29, 2012-Jun. 1, 2012; pp. 1027-1032.

Yang, F. et al., "Microstrip Antenna Integrated With Electromagnetic Band-Gap (EBG) Structures: A Low Mutual Coupling Design for Array Applications," IEEE Transaction on Antennas and Propagation, vol. 51, N. 10; Oct. 2003; pp. 2936-2946.

U.S. Appl. No. 14/490,849, filed Sep. 19, 2014, entitled "Integrated Circuit Package".

Non-Final Office Action dated Jan. 14, 2015 for U.S. Appl. No. 14/303,705, 7 pages.

Non-Final Office Action dated Feb. 16, 2016 for U.S. Appl. No. 14/303,713, 15 pages.

Non-Final Office Action dated Feb. 16, 2016 for U.S. Appl. No. 14/490,849, 7 pages.

Notice of Allowance dated Aug. 31, 2016 for U.S. Appl. No. 14/303,705, 8 pages.

Notice of Allowance dated Dec. 21, 2016 for U.S. Appl. No. 14/303,705, 13 pages.

Final Office Action dated Apr. 26, 2017 for U.S. Appl. No. 14/303,713, 17 pages.

Non Final Office Action; U.S. Appl. No. 14/473,038; dated May 30, 2017.

Notice of Allowance; U.S. Appl. No. 14/473,038; dated Oct. 2, 2017.

* cited by examiner

INTEGRATED CIRCUIT PACKAGE WITH RADIO FREQUENCY COUPLING ARRANGEMENT

CROSS REFERENCE TO RELATED APPLICATIONS

The present application is related to co-pending U.S. patent application Ser. No. 14/303,705, entitled "RADIO FREQUENCY COUPLING STRUCTURE," filed on Jun. 13, 2014, and co-pending U.S. patent application Ser. No. 14/303,713, entitled "INTEGRATED CIRCUIT PACKAGE WITH RADIO FREQUENCY COUPLING STRUCTURE," filed on Jun. 13, 2014, the entirety of which are herein incorporated by reference.

FIELD OF THE INVENTION

This invention relates to an integrated circuit package, a radio frequency device, a radar sensor and a method of manufacturing an integrated circuit package.

BACKGROUND OF THE INVENTION

An integrated circuit package typically may integrate radio frequency (RF) active and/or passive components. Such integrated circuit package may for example be electrically coupled to a device external to the integrated circuit package. In order to implement a radio frequency coupling between the integrated circuit package and the external device, radio frequency coupling arrangements with low radiation losses may be desired.

Techniques are described in literature to improve the radio frequency coupling between an integrated circuit package and devices external to the integrated circuit package.

An example of such techniques is shown in U.S. Pat. No. 8,169,060 B2. U.S. Pat. No. 8,169,060 B2 describes an example of an integrated circuit package assembly arranged to transfer an electromagnetic signal from an integrated circuit package to a waveguide external to the integrated circuit package.

The integrated circuit package assembly disclosed in U.S. Pat. No. 8,169,060 B2 includes an integrated circuit package and a printed circuit board substrate. The printed circuit board substrate includes a waveguide. The integrated circuit package houses a first antenna that is configured to radiate a first electromagnetic signal. The waveguide generates a waveguide signal based on the first electromagnetic signal, and passes the waveguide signal to a second antenna that is electrically coupled to the waveguide. The second antenna is configured to radiate a second electromagnetic signal received from the waveguide. A conductive layer is formed over an external surface on the integrated circuit package, extends over a top dielectric layer of the integrated circuit package and reflects power radiated from the first antenna towards the waveguide.

However, the radio frequency coupling between the first antenna and the second antenna via the conductive layer and the waveguide cannot be controlled such that at the same time low radiation losses and good reproducibility of the radio frequency coupling are achieved.

SUMMARY OF THE INVENTION

The present invention provides an integrated circuit package, a radio frequency device, a radar sensor and a method of manufacturing an integrated circuit package as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

DETAILED DESCRIPTION OF THE PREFERRED EMBODIMENTS

Figure 1:
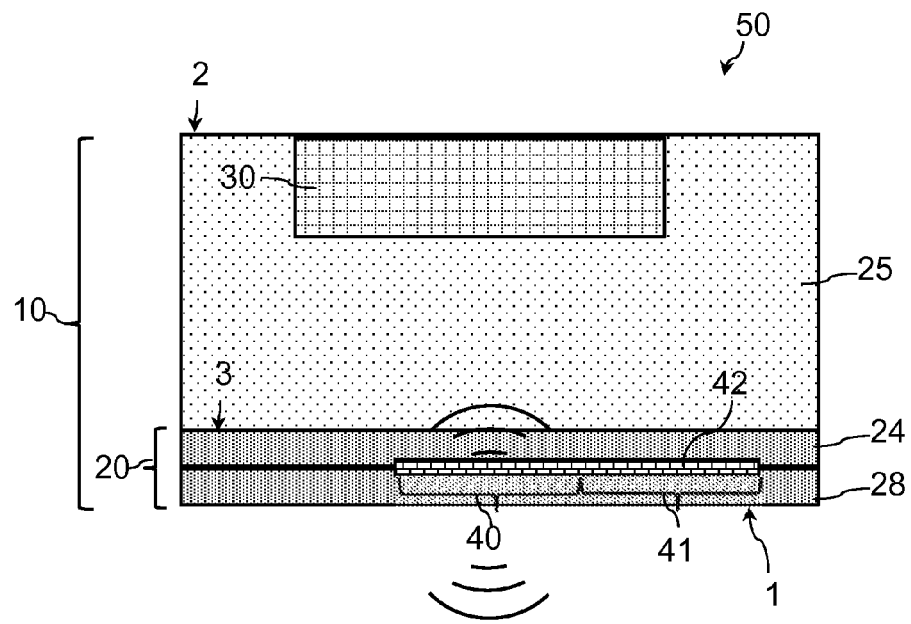
FIG. 1 shows a cross-section of an example of an integrated circuit package taken along the line I-I in FIG. 2.
Figure 2:
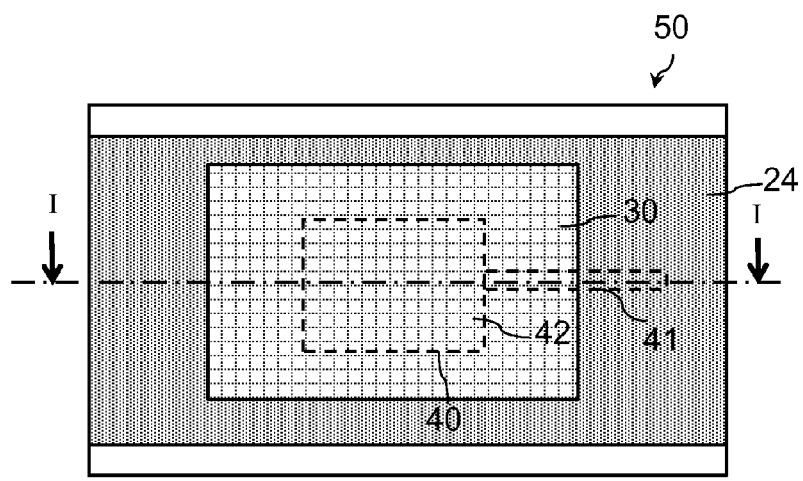
FIG. 2 shows a top view of the example shown in FIG. 1.

FIGS. 1 and 2 show a cross-section and a top view of an example of an integrated circuit package 50. The cross-section shown in FIG. 1 is taken along the line I-I of the top view shown in FIG. 2.

The integrated circuit package 50 comprises a radio frequency (RF) coupling structure 10 which is arranged inside the integrated circuit package 50. The RF coupling arrangement 10 comprises a first stack 20 comprising at least a first electrically isolating layer 24 and a second electrically isolating layer 28, an electrically conductive material 30, a dielectric material 25, and an integrated antenna structure 42.

The first stack 20 is arranged on a first side 1 of the integrated circuit package 50. The first stack 20 may include more than two electrically isolating layers. The electrically conductive material 30 is arranged inside the integrated circuit package 50. The electrically conductive material 30 is arranged at a second side 2 of the integrated circuit package 50 which is opposite to the first side 1. The dielectric material 25 is arranged between the first stack 20 and the electrically isolating layer 30. The integrated antenna structure 42 is used to transmit and/or receive a radio frequency signal. The integrated antenna structure 42 is arranged between the first electrically isolating layer 24 and the second electrically isolating layer 28. The electrically conductive material 30 is separated from the first stack 20 by at least the dielectric material 25. The electrically conductive material 30 is arranged to partly overlap the integrated antenna structure 42. The electrically conductive material 30 is separated from the integrated antenna structure 42 by at least the first electrically isolating layer 24 and the dielectric material 25. The electrically conductive material 30 is arranged to reflect the RF signal received by the electrically conductive material 30 through at least the dielectric material 25 and the first electrically isolating layer 24 to the first side 1.

The electrically conductive material 30 may have any shape suitable for the specific implementation. For example, as shown in FIG. 1, the electrically conductive material 30 may have a rectangular cuboid shape partly overlapping the integrated antenna structure 42. The electrically conductive material 30 may have a cylindrical shape or another solid shape with suitable thickness, e.g. in a range of 75-125 um or more. The electrically conductive material 30 may be made of high electrical conductivity material, for example copper. The electrically conductive material 30 may be electrically connected to a reference potential. The reference potential may be for example ground or a negative potential.

The RF signal may be generated by a transceiver (not shown in FIG. 1) electrically coupled to the integrated antenna structure 42 and therefrom radiated towards the electrically conductive material 30. The RF signal may be originated at the first side 1 from a device (not show in the FIG. 1) external to the integrated circuit package 50. The RF signal may thus be directly received from the first side 1 by the integrated antenna structure 42 or indirectly received by the integrated antenna structure 42 via one or multiple reflections in the electrically conductive material 30. The integrated antenna structure 42 may be implemented in any manner suitable for the specific implementation.

The integrated antenna structure 42 may be a suitable type of integrated planar antenna of one of the group consisting of: a single-ended microstrip antenna, a differential microstrip antenna, a rectangular patched single-ended antenna, a rectangular patched differential antenna, a square patched single-ended antenna, and a square patched differential antenna. The integrated antenna structure 42 may be, as shown in FIG. 1, sandwiched between the first electrically isolating layer 24 and the second electrically isolating layer 28.

For example, as shown in FIG. 2, the integrated antenna structure 42 may be a planar rectangular patched single-ended antenna. The planar rectangular patched single-ended antenna 42 may comprise a transmission line 41 and a planar rectangular patched element 40. The transmission line 41 may feed the rectangular patched element 40. The transmission line 41 may extend in a planar direction defined by the planar rectangular patched element 40 in a region of the first stack 20 where the electrically conductive material 30 overlaps the planar rectangular patched element 40. The transmission line 41 may be electrically connected or coupled to a transceiver, a transmitter and/or a receiver. The rectangular patched element 40 and the transmission line 41 may be both made of a high conductive metal, e.g. copper.

The first stack 20 may include more than two electrically isolating layers. The integrated antenna structure 42 may be a planar antenna located between two electrically isolating layers other than the first electrically isolating layer 24 and the second electrically isolating layer 28. The integrated antenna structure 42 may be a non-planar single-ended or differential integrated antenna arranged between two or more electrically isolating layers. The integrated antenna structure may be formed with two or more electrically conductive layers, e.g. made of copper, arranged between the two or more electrically isolating layers. The two or more electrically conductive layers may be connected together via electrically conductive via holes extending through the two or more electrically isolating layers. For example, the integrated antenna structure may have more than two or more patches. Each patch may be located in a different electrically conductive layer of the first stack. The two or more patches may be electrically connected together via the electrically conductive via holes extending through the two or more electrically isolating layers.

Since the RF coupling arrangement 10 is entirely integrated in the integrated circuit package 50, the RF coupling arrangement 10 can be more compact and with less radiation losses as compared to, for example, the RF coupling arrangement of the integrated circuit package assembly disclosed in U.S. Pat. No. 8,169,060 B2. In the integrated circuit package assembly described in U.S. Pat. No. 8,169,060 B2, the conductive material reflecting the radio frequency signal is located externally to the integrated circuit package, thereby making the integrated circuit package assembly mechanically more complex than in the present proposed solution.

The integrated circuit package 50 can be more mechanically stable as compared to the cited prior art solution because the integrated antenna structure 42, the electrically conductive material 30 and the first electrically isolating layer 24 and the second electrically isolating layer 28 are assembled together inside the integrated circuit package 50. The dielectric material 25 may be made of a moulding plastic compound. The moulding plastic compound may encapsulate the electrically conductive material 30 to obtain a more robust RF coupling arrangement 10. Furthermore, since the electrically conductive material 30 is placed inside the integrated circuit package 50, the electrically conductive material 30 may be better protected against environmental changes such as for example thermal stresses, moisture, etc. By having the electrically conductive material 30 separated from the integrated antenna structure 42 by at least the dielectric material 25 and the first electrically isolating layer 24, e.g., at a distance from the integrated antenna structure 42, the radiating efficiency of the RF coupling arrangement 42 may be further enhanced and radiation losses of the RF coupling arrangement 10 reduced.

Figure 3:
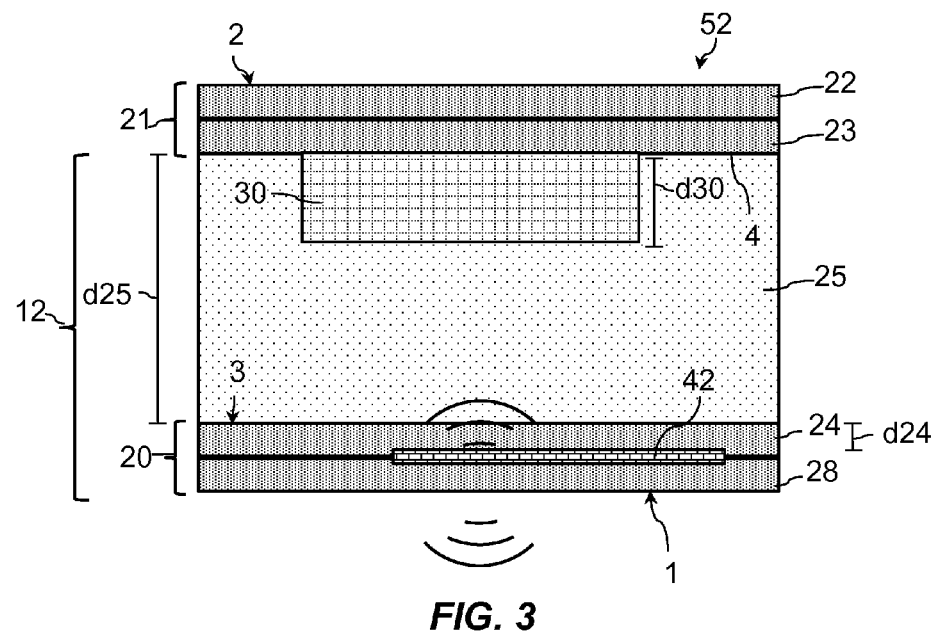
FIG. 3 shows a cross-section of an example of an integrated circuit package.

FIG. 3 shows a cross-section of another example of an integrated circuit package 52. The integrated circuit package 52 may have the same top view shown in FIG. 2. The integrated circuit package 52 comprises a RF coupling arrangement 12. The RF coupling arrangement 12 is equivalent to the RF coupling arrangement 10 described with reference to FIGS. 1 and 2. The integrated circuit package 52 differs from the integrated circuit package 50 in that the integrated circuit package 52 further comprises a second stack 21 arranged at the second side 2. The second stack 21 comprises at least a third electrically isolating layer 22 and a fourth electrically isolating layer 23 both arranged at the second side 2. The first stack 20 is separated from the second stack 21 by at least the dielectric material 25. The electrically conductive material 30 may be arranged, as shown in FIG. 3, on a face 4 of the second stack 21 opposite to the second side 2. The electrically conductive material 30 is encapsulated by the dielectric material 25. The electrically conductive material 30 is directly in contact with the face 4 of the second stack 21 which is in direct contact with the dielectric material 25. In this example, the electrically conductive material 30 may be made much thicker than for example the first, second, third and fourth electrically isolating layers 24, 28, 22 and 23. For example, the first electrically isolating layer 24 may have a thickness d24 in a range between 10 microns to 20 microns. The second electrically isolating layer 28, the third and the fourth electrically isolating layers 22 and 23 may have respective thicknesses substantially equivalent to the thickness d24. The electrically conductive material 30 may have a thickness d25 in a range between 75 microns to 150 microns. A thick electrically conductive material 30 may improve robustness and reproducibility of performance of the RF coupling arrangement 12. For example, the electrically conductive material 30 may have a thickness d30 in a range of 125 microns to 200 microns. However, the thickness d25 of the dielectric material 25 may be may be larger than 150 microns or smaller than 75 microns or the thickness d30 of the electrically conductive material 30 may be larger than 200 microns or smaller than 125 microns in order to enhance a control of the distance between the integrated antenna structure 42 and the electrically conductive material 30. Alternatively, the electrically conductive material 30 may be formed with a cavity (not shown in the Figures) facing the integrated antenna structure 42. The cavity may have for example an opening facing the first stack 20. The cavity may be filled with any dielectric material suitable for the specific implementation. For example, the cavity may be filled with the same moulding compound 25 of the integrated circuit package 52, left empty, or filled with a gas, e.g. air, or another dielectric gas. By choosing appropriate shape and size of the cavity and by choosing the dielectric material filling the cavity with a desired dielectric constant, the distance between the integrated antenna structure 42 and the electrically conductive element 30 may be better controlled, thereby further reducing the radiation losses of the RF coupling arrangement 12. For example, the distance between the integrated antenna structure 42 and the electrically conductive element 30 may be set to obtain an electrical length of the integrated antenna structure 42 substantially equivalent to a quarter wavelength.

Figure 4:
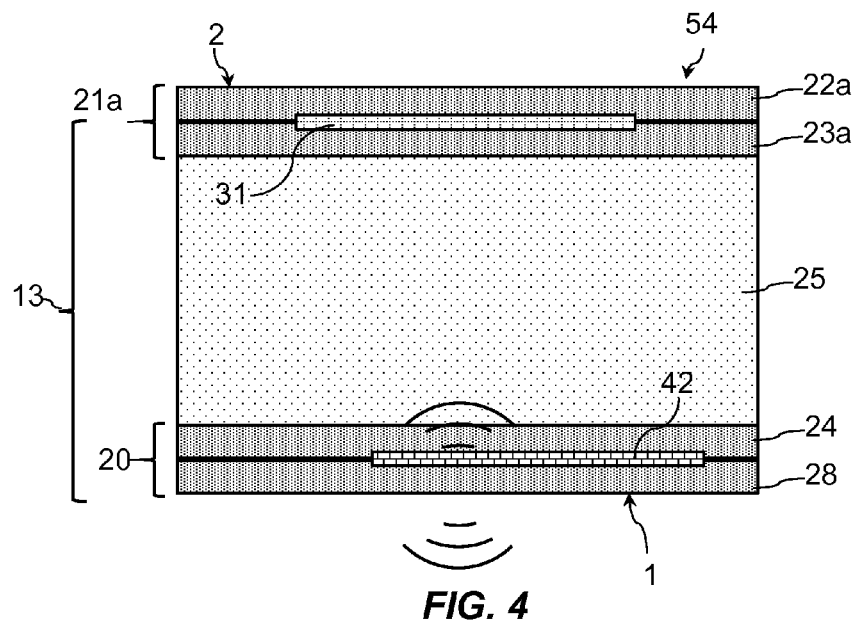
FIG. 4 shows a cross-section of an example of an integrated circuit package.

FIG. 4 shows a cross-section of another example of an integrated circuit package 54. The integrated circuit package 54 may have the same top view shown in FIG. 2. In FIG. 4 an electrically conductive material 31 is arranged inside a second stack 21a between a third electrically isolating layer 22a and a fourth electrically isolating layer 23a. The second side 21a is arranged at the second side 2 of the integrated circuit package 54 which is opposite to the first side 1. The integrated circuit package 54 comprises a RF coupling arrangement 13a which extends inside the second stack 21a. The electrically conductive material 31 may be separated from the integrated antenna structure 42 by at least the fourth electrically isolating layer 23a, the dielectric material 25 and the first electrically isolating layer 24. In this example, the distance between the integrated antenna structure 42 and the electrically conductive material 31 is further increased by at least a thickness of the fourth electrically isolating layer 23a.

Figure 5:
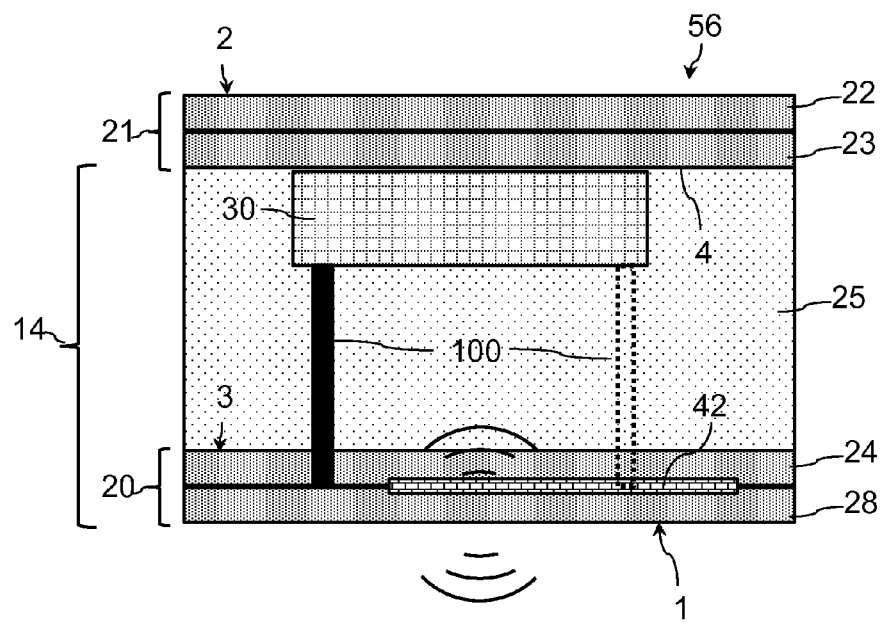
FIG. 5 shows a cross-section of an example of an integrated circuit package taken along the line V-V in FIG. 6.
Figure 6:
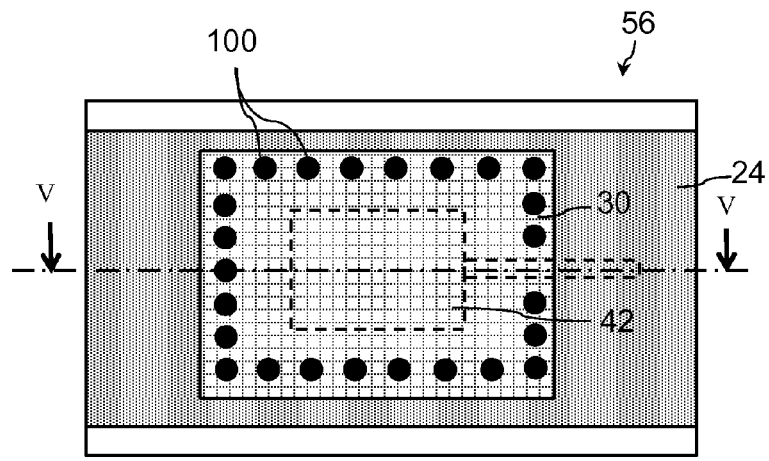
FIG. 6 shows a top view of the example shown in FIG. 5.

FIGS. 5 and 6 show a cross-section and a top view of another example of an integrated circuit package 56. The cross section of FIG. 5 is taken along the line V-V in FIG. 6. Elements in the FIGS. 5 and 6 with the same reference numbers as in the FIG. 3 have the same function and will be hereafter not described.

The integrated circuit package 56 comprises a radio frequency coupling arrangement 14. The RF coupling arrangement 14 differs from the RF coupling arrangement 12 in that the integrated antenna structure 42 may be surrounded by electrical conductive vias 100 extending through at least the first electrically isolating layer 24 and the dielectric material 25. The electrically conductive vias 100 may be electrically connected to the electrically conductive material 30. The electrically conductive vias 100 may confine a radiating energy transferred between the integrated antenna structure 42 and the electrically conductive material 30 within a region of the RF coupling arrangement 14 delimited by the surrounding electrically conductive vias 100. The radiation losses of the RF coupling arrangement 14 may be further decreased. Electromagnetic sources external to the RF coupling arrangement 14 may interfere with the operation of the RF coupling arrangement 14 shown in FIG. 5. The electrically conductive vias 100 may further increase electromagnetic isolation between the RF coupling arrangement 14 shown in FIG. 5 and external electromagnetic sources, thereby reducing the electromagnetic interferences. The external electromagnetic sources may be for example coming from other RF coupling arrangements adjacent to the RF coupling arrangement and/or from other RF devices producing electromagnetic interferences. The electrically conductive vias 100 may be extending through the second electrically isolating layer 28 or, in case the first stack 20 comprises more than two electrically isolating layers, through all electrically isolating layers of the first stack 20.

Figure 7:
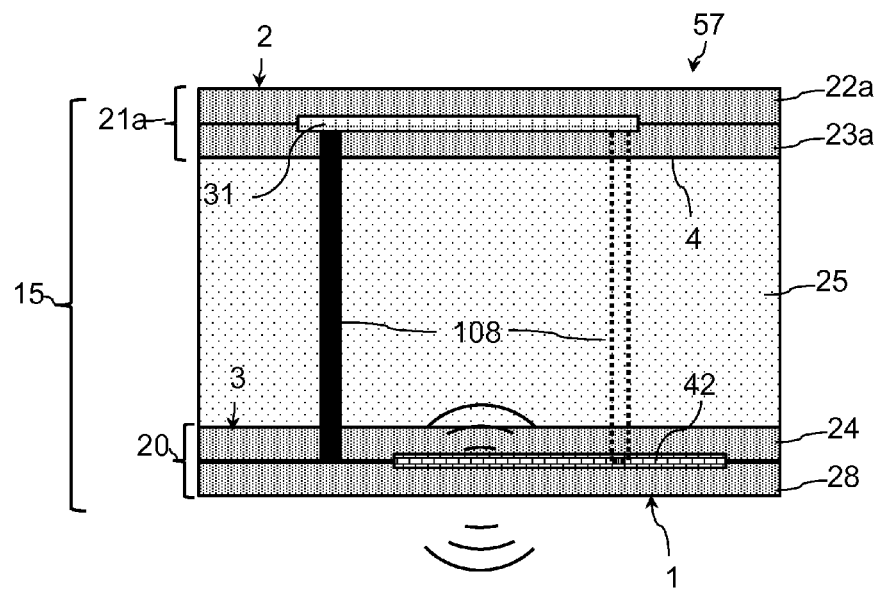
FIG. 7 shows a cross-section of an example of an integrated circuit package taken along the line VII-VII in FIG. 8.
Figure 8:
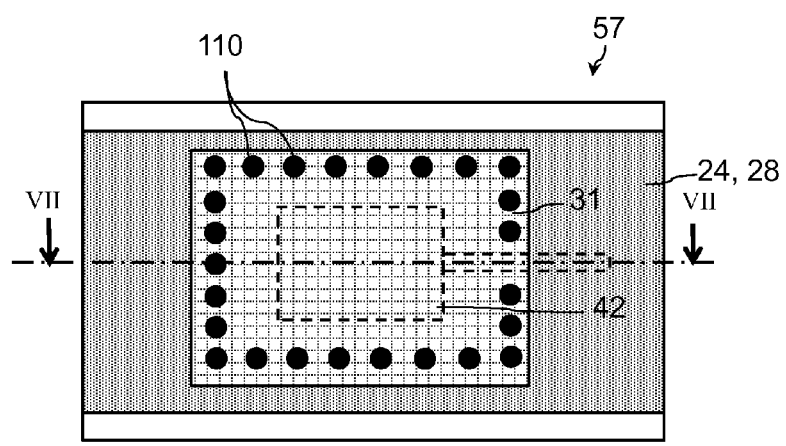
FIG. 8 shows a top view of the example shown in FIG. 7.

FIGS. 7 and 8 show a cross-section and a top view of another example of an integrated circuit package 57. The cross section of FIG. 7 is taken along the line VII-VII in FIG. 8. In this example, the integrated circuit package 57 comprises, as shown with reference to the cross-section of FIG. 4, an electrically conductive material 31 sandwiched between the third electrically isolating layer 22a and the fourth electrically isolating layer 23a. The integrated circuit package 57 comprises a radio frequency coupling arrangement 15 which extends inside the second stack 21a. The RF coupling arrangement 15 differs from the RF coupling arrangement 13 described with reference to FIG. 4 in that a plurality of electrically conductive vias 108 may be arranged to surround the integrated antenna structure 42 for isolating the integrated antenna structure 42 from electromagnetic interferences. The electrically conductive vias 108 may be extending through the first electrically isolating layer 24, the dielectric material 25 and the fourth electrically isolating layer 23a and be in electrical contact with the electrically conductive material 31.

Figure 9:
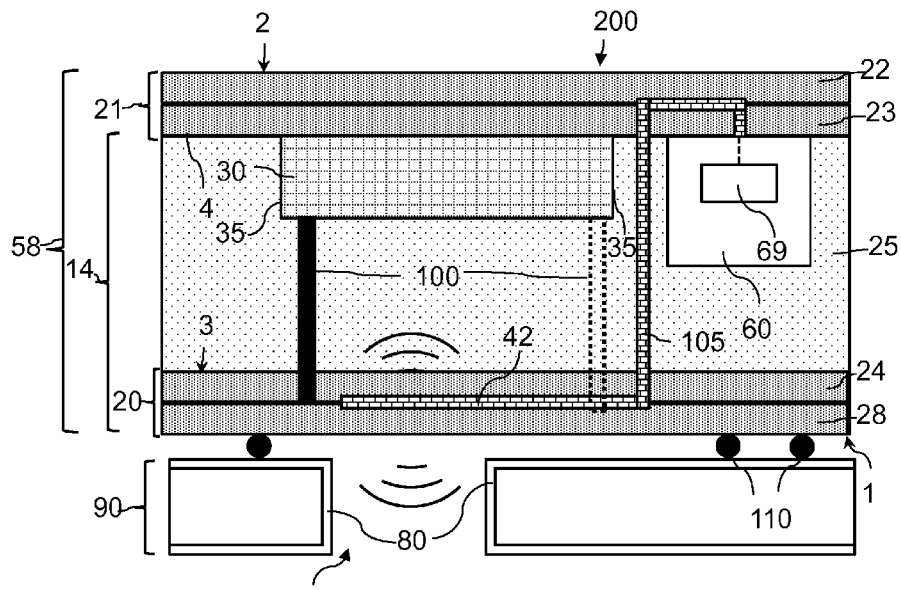
FIG. 9 shows a cross-section of an example of a radio frequency device.

FIG. 9 shows a cross-section of an example of a radio frequency device 200. The RF device 200 comprises an integrated circuit package 58 and a printed circuit board (PCB) 90 on which the integrated circuit package 58 is mounted via a plurality of solder balls 110. The integrated circuit package 58 comprises the RF coupling arrangement 14 as shown in FIG. 3. The RF coupling arrangement 14 comprises the integrated antenna structure 42 and the electrically conductive material 30. The integrated antenna structure 42 may be surrounded by electrically conductive vias 100. The PCB 90 comprises a RF waveguide 70 located at an area at the first side 1 of the integrate circuit package 58 adjacent to the integrated antenna structure 42. The RF waveguide 70 is arranged to face the first stack 20 at the first side 1. The integrated antenna structure 42 may comprise a planar rectangular patch element which may be electrically coupled, e.g. via the transmission line, to an integrated circuit die 60. The integrated circuit die 60 may be arranged to generate the RF signal. The RF signal may be transmitted via the integrated antenna structure 42. The integrated circuit die 60 may be arranged to receive the RF signal as received via the integrated antenna structure 42. The integrated circuit package 58 is mechanically attached to the RF waveguide 70 via the solder balls 110. The integrated circuit package 58 is electrically coupled to the RF waveguide 70 to guide the RF signal out of a plane parallel to a surface 3 of the first electrically isolating layer 24. The surface 3 is in direct contact with the dielectric material 25 and faces the electrically conductive material 30. The RF signal may be directly transmitted away from integrated circuit package 58 towards the RF waveguide 70 via the integrated antenna structure 42. Alternatively or additionally, The RF signal may be indirectly transmitted away from integrated circuit package 58 towards the RF waveguide 70 via the integrated antenna structure 42 and via one or more reflections of the RF signal with the electrically conductive material 30. The RF signal may be received from the first side 1 via the waveguide 70 and directed towards the integrated circuit package 58. The RF signal may be directly received by the integrated antenna structure 42 from the first side 1. Alternatively or additionally, the RF signal may be indirectly received by the integrated antenna structure 42 from the first side 1 after one or more reflections with the electrically conductive material 30. As shown in FIG. 9, the RF waveguide 70 may be formed in the PCB 90. The RF waveguide 70 may be formed via a hole formed in the PCB 90 extending through the PCB 90 to an area of the integrated circuit package 58 corresponding to the RF coupling arrangement 14. This area may partly overlap the integrated antenna structure 42. The area may completely overlap the planar rectangular patch element (as shown in FIG. 1) of the integrated antenna structure 42. The hole may have lateral walls covered by an electrically conductive layer 80 within which the RF signal may be guided. The lateral walls of the hole forming the RF waveguide 70 may substantially correspond to respective lateral walls 35 of the electrically conductive material 30. The lateral walls of the hole defined may for example be aligned with the lateral walls 35 of the electrically conductive material 30.

The integrated circuit die 60 may be arranged inside the integrated circuit package 58 as shown in FIG. 8. The integrated circuit die 60 may have a surface in direct contact with the face 4 of the second stack 21 opposed to the second side 2. The integrated circuit die 60 may be soldered to the face 4 of the second stack 21 and in electrical contact with the integrated antenna structure 42 via one or more electrically conductive via holes 105 extending through at least the fourth electrically isolating layer 23, the dielectric material 25 and the first electrically isolating layer 24. Alternatively, in an example not shown in the Figures, the integrated circuit die 60 may be arranged outside the integrated circuit package 58 and electrically connected to the integrated antenna structure 42 via for example a lead terminal of the integrated circuit package 58.

The integrated circuit die 60 may comprise a circuit arranged to generate the RF signal. Alternatively or additionally, the circuit may be arranged to receive the RF signal as received via the integrated antenna structure 42. The circuit may be of any type suitable for the specific implementation.

For example, the integrated circuit die 60 may comprise a circuit 69 of the group of circuits consisting of: a transceiver, a receiver and a transmitter.

The integrated circuit die 60 may be manufactured with any semiconductor technology suitable for the specific implementation.

For example, the integrated circuit die 60 may be manufactured using a semiconductor technology of the group of semiconductor technologies comprising: a silicon, a silicon germanium, a gallium arsenide, a gallium nitride semiconductor technology or a combination thereof.

Figure 10:
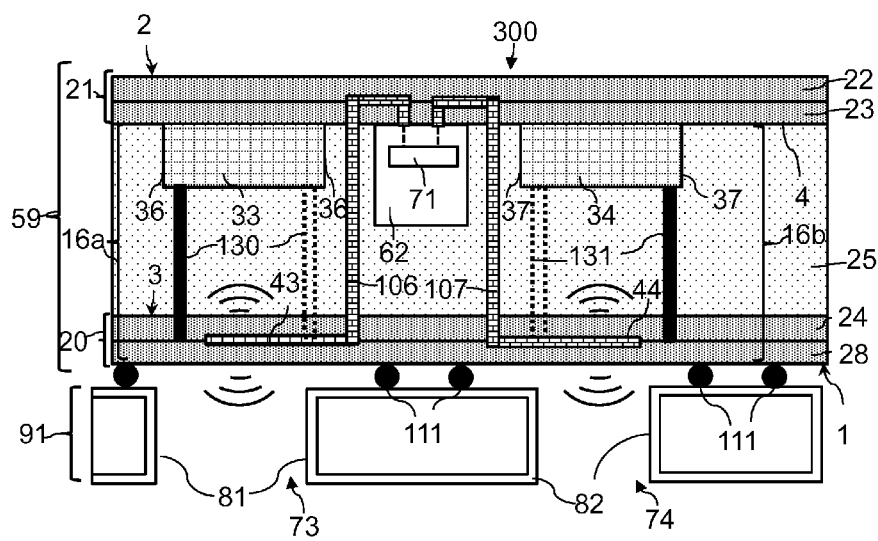
FIG. 10 shows a cross-section of an example of a radio frequency device.

FIG. 10 shows a cross-section of another example of a radio frequency device 300. The RF device 300 comprises an integrated circuit package 59 comprising a first and a second radio frequency coupling arrangements 16a and 16b. The first RF coupling arrangement 16a comprises a first integrated antenna structure 43 and a first electrically conductive material 33. The second RF coupling arrangement 16b comprises a second integrated antenna structure 44 and a second electrically conductive material 34. The first and second integrated antenna structures 43 and 44 may be both sandwiched between the first electrically isolating layer 24 and the second electrically isolating layer 28. The first integrated antenna structure 43 and the second integrated antenna structure 44 may both be surrounded by first and second electrically conductive vias 130 and 131, respectively. The first and second electrically conductive vias 130 and 131 may be arranged through at least the first electrically isolating layer 24 and the dielectric material 25. The first electrically conductive material 33 and the second electrically conductive material 34 may both have a cavity. The first integrated antenna structure 43 may be electrically coupled, e.g. via a first transmission line and one or more first via holes 106, to an integrated circuit die 62. The second integrated antenna structure 44 may be electrically coupled, e.g. via a second transmission line and one or more second via holes 107, to the integrated circuit die 62. The integrated circuit die 62 may include a circuit. The circuit 71 may be of the same type of circuits as described with reference to the integrated circuit device 69 shown in FIG. 9. The circuit 71 may be arranged to transmit and/or receive a first RF signal in a first predetermined frequency band. Alternatively or additionally, the circuit 71 may be arranged to transmit and/or receive a second RF signal in a second predetermined frequency band. The first antenna structure 43 may be arranged for transmitting and/or receiving the first RF signal in the first predetermined frequency band. The second antenna structure 44 may be arranged for transmitting and/or receiving the second RF signal in the second predetermined frequency band.

The integrated circuit package 59 is mounted on the PCB 91 at the first side 1 of the integrated circuit package 91 via a plurality of solder balls 111. The PCB 91 comprises a first radio frequency waveguide 73 and a second radio frequency waveguide 74. The first RF waveguide 73 is located at a first area at the first side 1 of the integrated circuit package 59 adjacent to the first antenna structure 43. The second RF waveguide 74 is located at a second area at the first side 1 of the integrated circuit package 59 adjacent to the second antenna structure 44. The integrated circuit package 59 may be mechanically attached to the first RF waveguide 73 and to the second RF waveguide 74 via the solder balls 111. The integrated circuit package 59 is electrically coupled to the first waveguide 73 to guide the first RF signal in the PCB 91 out of the plane parallel to the surface 3 of the first electrically isolating layer 24. The integrated circuit package 59 is electrically coupled to the second waveguide 74 to guide the second RF signal in the PCB 91 out of the plane parallel to the surface 3 of the first electrically isolating layer 24. The first RF signal and the second RF signal may be transmitted away from the integrated circuit package 59. The first RF signal and the second RF signal may be transmitted towards the integrated circuit package 59. The first RF waveguide 73 and the second RF waveguide 74 may both be formed in the PCB 91 by arranging two separate holes extending through the PCB 91. A first hole forming the first RF waveguide 73 may have lateral walls covered by a first electrically conductive layer 81. A second hole forming the second RF waveguide 74 may have lateral walls covered by a second electrically conductive layer 82. The first and second holes may extend to an area of the respective first and second RF coupling arrangements 16*a* and 16*b* partly overlapping the respective first and second integrated antenna structures 43 and 44 and the respective first and second electrically conductive materials 33 and 34. For example, the lateral walls of the first hole may correspond, e.g. aligned, to respective lateral walls 36 of the first electrically conductive material 33. The lateral walls of the second hole may correspond, e.g. aligned, to respective lateral walls 37 of the second electrically conductive material 34.

The RF device 300 may be a two-frequency channels RF device. For example, the first RF signal may be received and/or transmitted in the first predetermined frequency band. The second RF signal may be received and/or transmitted in the second predetermined frequency band. The first predetermined frequency band may overlap the second predetermined frequency band. Alternatively, the first predetermined frequency band may not overlap the second predetermined frequency band. More than two RF coupling arrangements may be integrated in the same integrated circuit package and electrically coupled to more than two RF waveguides in order to provide a RF device with more than two frequency channels.

For the embodiments described below, elements in the FIGS. 11 and 12 with the same reference numbers as in the corresponding FIG. 9 will be not described.

Figure 11:
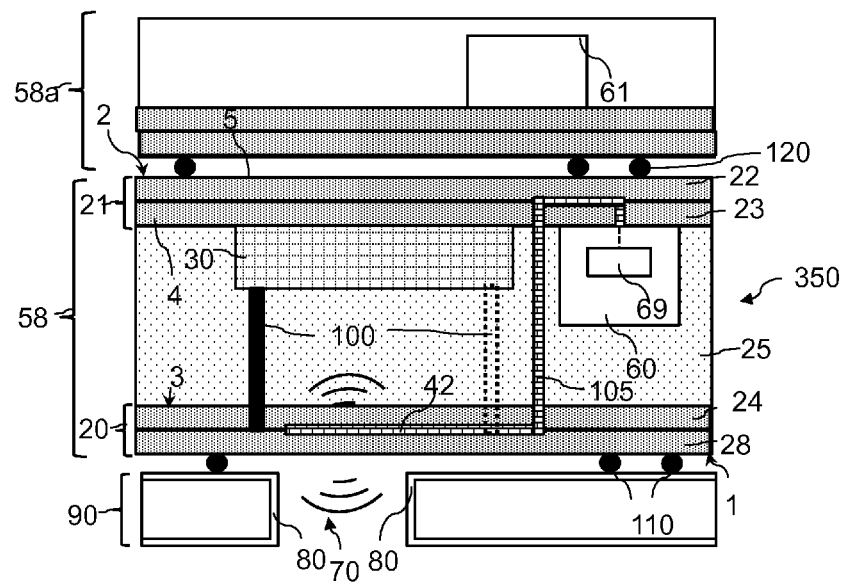
FIG. 11 shows a cross-section of an example of a radio frequency device.

FIG. 11 shows a cross-section of another example of a radio frequency device 350. The RF device 350 differs from RF device 200 in that a further integrated circuit package 58*a* is mounted on the integrated circuit package 58 via for example a first plurality of solder balls 120. The integrated circuit package 58*a* may be mounted on a face 5 of the second stack 21 corresponding to the second side 2 of the integrated circuit package 58. The face 5 of the second stack 21 is external to the integrated circuit package 58. The face 5 is opposite to the face 4 of the second stack 21 which is internal and in direct contact with the dielectric material 25. The integrated package 58*a* may for example comprise a further integrated circuit die 61. The integrated circuit package 58 and the further integrated circuit package 58*a* may be in electrical contact via the solder balls 120 and one or more electrical conductive vias (not shown in the FIG. 11) through one or more electrically isolating layers of the second stack 21.

Figure 12:
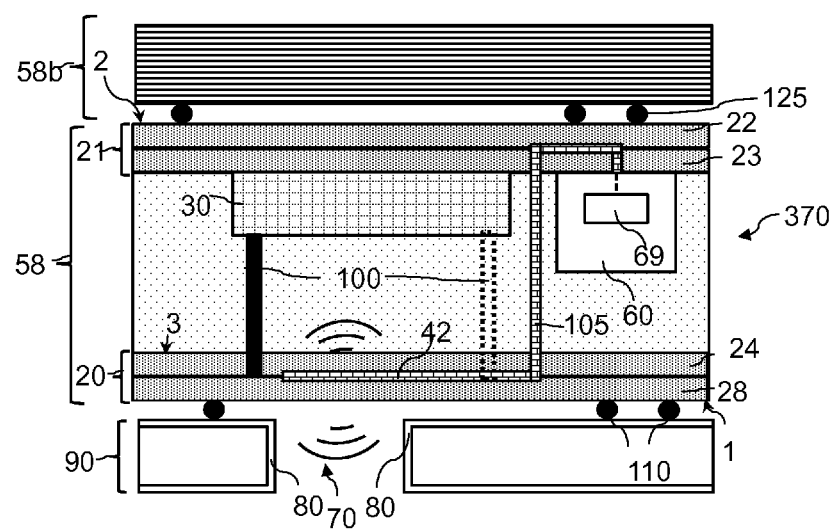
FIG. 12 shows a cross-section of an example of a radio frequency device.

FIG. 12 shows a cross-section of another example of a radio frequency device 370. The RF device 370 differs from the RF device 350 in that a heat sink 58*b* may be mounted in the same manner on the integrated circuit package 58. The heat sink 58*b* may dissipate heat generated in the integrated circuit package 58. For example, the integrated circuit die 60 may comprise high power devices generating heat during operation. The heat sink 58*b* may for example be thermally coupled to the integrated circuit die 60 via for example the solder balls 125. Alternatively, the heat sink 58*b* may be electrically connected to the integrated circuit die 60, e.g. with electrically conductive vias extending through the third and fourth electrically isolating layers 22 and 23 and the solder balls 130. The heat sink 58*b* may for example be used as a ground plane for the integrated circuit die 60. The heat sink 58*b* may contribute to an effective heat transfer from the integrated circuit package 58 to for example the external environment.

The RF devices 200, 300, 350 or 370 may be used in RF systems of one of the group of RF system comprising: a wireless LAN, an E-band backhaul solutions, a radar system.

For example, the RF devices 200, 300, 350 or 370 may be a radar sensor working at any frequency range suitable for the specific radar system. For example, in a short detection range, e.g., within 5 to 10 meters detection range, the radar sensors may be working at a frequency range of 24-25 GHz, for an intermediate and long detection range, e.g., within 100 meters detection range and beyond, the radar sensors may be working at a frequency range of 76-81 GHz.

Figure 13:
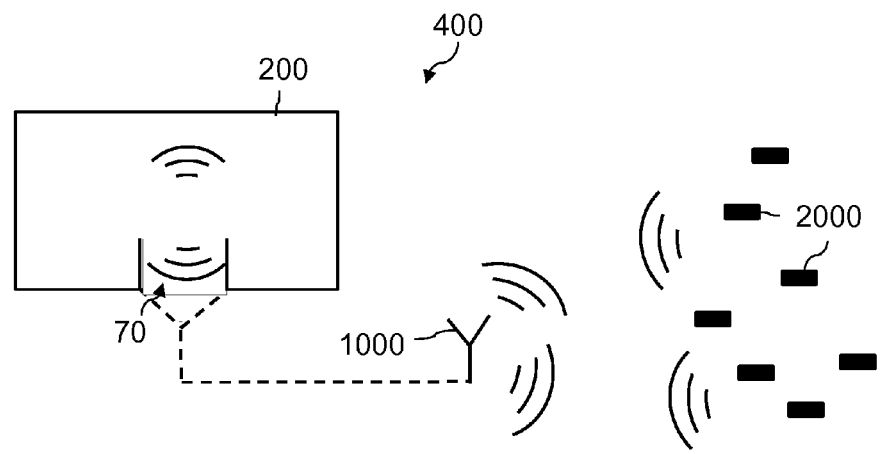
FIG. 13 schematically shows an example of a radar sensor.

FIG. 13 schematically shows an example of a radar sensor 400. The radar sensor 400 comprises the RF device 200 or 350 or 370 as described with reference to the examples shown in FIGS. 8, 11 and 12 and an antenna 1000. The antenna 1000 may be electrically coupled to the RF waveguide 70, e.g. via a coaxial cable, an RF connector soldered or screwed in the PCB (not shown in FIG. 13) of the RF device 200. The antenna 1000 is electrically coupled to the RF waveguide 70 to transmit and/or receive the RF signal through a frequency channel. The radar sensor 400 may detect a set of targets 2000 in a field of view of e.g. an automotive vehicle within a predetermined detection range. The RF signal may be transmitted from a transceiver in the RF device 200 via the RF waveguide 70, and via the antenna 1000 to the targets 2000. The RF signal may be reflected back from the set of targets 2000 to the antenna 1000. The transceiver in the RF device 200 may receive the RF signal reflected back from the set of targets 2000.

Figure 14:
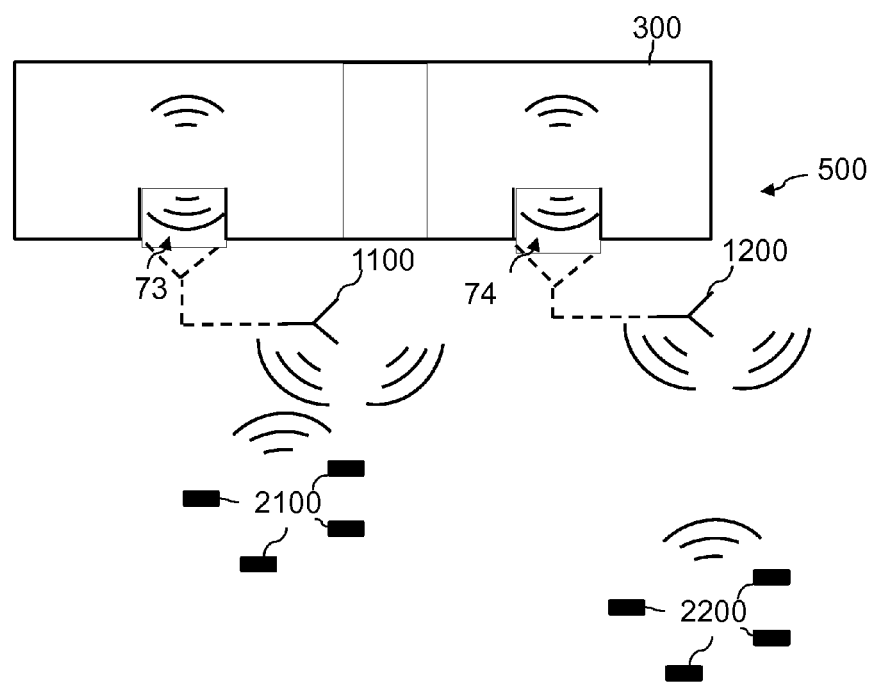
FIG. 14 schematically shows an example of a radar sensor.

FIG. 14 schematically shows another example of a radar sensor 500. The radar sensor 500 may comprise a two-frequency channels RF device 300 for example as described with reference to FIG. 10. The RF device 300 comprises a first RF waveguide 73 and a second RF waveguide 74. The first RF waveguide 73 is electrically coupled to a first antenna 1100 and the second RF waveguide 74 is electrically coupled to a second antenna 1200. The first antenna 1100 may be arranged to transmit and/or receive a first RF signal in a first predetermined frequency band. The second antenna 1200 may be arranged to transmit and/or receive a second RF signal in a second predetermined frequency band. The first predetermined band may overlap the second predetermined frequency band. The first predetermined band may not overlap the second predetermined frequency band. The first RF waveguide 73 may be coupled, as described with reference to the example shown in FIG. 10, to a transceiver arranged to transmit and/or receive in the first predetermined frequency band. The second RF waveguide 74 may be coupled to the same or another transceiver arranged to transmit and/or receive in the second predetermined frequency band. The radar sensor 500 may detect a first set of targets 2100 within a first predetermined detection range and a second set of targets 2200 within a second predetermined detection range. Alternatively or additionally, the radar sensor 500 may detect a first set of targets 2100 within a first predetermined velocity range and a second set of targets 2200 within a second predetermined velocity range. The radar sensor 500 may use the first predetermined frequency band to detect the first set of targets 2100 within the first detection range and the second predetermined frequency band to detect the second set of targets 2200 within the second detection range. Alternatively or additionally, the radar sensor 500 may use the first predetermined frequency band to detect the second set of targets 2200 within the first velocity range and the second predetermined frequency band to detect the second set of targets 2200 within the second predetermined velocity range. The first predetermined detection range may be smaller or higher than the second predetermined detection range. The first predetermined velocity range may be smaller or higher than the second predetermined velocity range.

Figure 15:
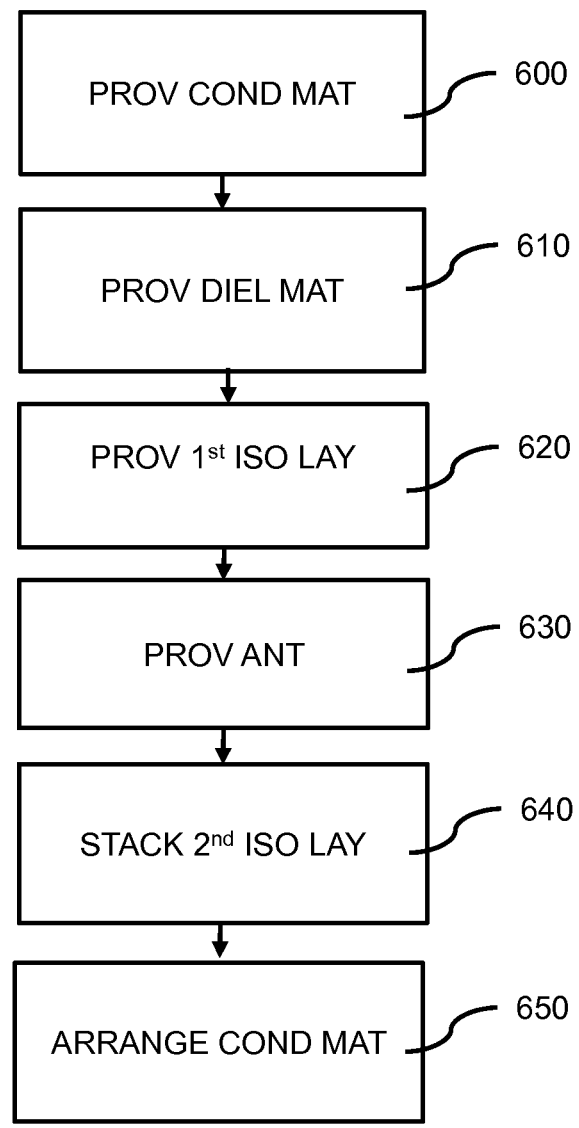
FIG. 15 schematically shows a flow diagram of a method of manufacturing an integrated circuit package.

FIG. 15 schematically shows a flow diagram of a method of manufacturing an integrated circuit package. The integrated circuit package may be any of the integrated circuit packages 50, 52, 54, 56, 57, 58, 58a or 59 described with reference to the FIGS. 1-11. The method will be here below described with reference to the example of FIG. 1 and to the flow diagram of FIG. 15.

The method comprises: providing 600 an electrically conductive material 30 inside the integrated circuit package 50 at the second side 2, providing a dielectric material 25 on at least the electrically conductive material 30, providing 620 a first electrically isolating layer at the first side 1 of the integrated circuit package 50 on at least the dielectric material 25. The method comprises providing 630 an integrated antenna structure 42 on at least the first electrically isolating layer 24 such that the integrated antenna structure 42 is separated from the electrically conductive material 30 by at least the first electrically isolating layer 24 and the dielectric material 25, stacking 640 a second electrically isolating layer 28 at the second side 2 on at least the first electrically isolating layer 24 and on the integrated antenna structure 42. The integrated antenna structure 42 is arranged between the first electrically isolating layer 24 and the second electrically isolating layer 28. The method further comprises arranging 650 the electrically conductive material 30 such to partly overlap the integrated antenna structure 42 to reflect the radio frequency signal received by the electrically conductive material 30 through at least the first electrically isolating layer 24 and the dielectric material 25 to the first side 1.

With reference to the example of the integrated circuit package 58 shown in FIG. 9, the method may additionally comprise providing an integrated circuit die 60 at the same with providing 600 the electrically conductive material 30. The integrated circuit die 60 may be placed with an active side in contact with the face 4 of the second stack 21 internal to the integrated circuit package 58. The integrated circuit die 60 may be electrically connected to the integrated antenna structure 42 by forming electrically conductive vias 105 extending through at least the fourth electrically isolating layer 23 and the first electrically isolating layer 24. The electrically conductive material 30 and the integrated circuit die 60 may for example be placed as separate components on a face of a substrate corresponding to the face 4. The electrically conductive material 30 together with the integrated circuit die 60 may be encapsulated with the dielectric material 25, e.g. a plastic moulding compound, for example a silica-filled epoxy moulding compound, to obtain a panel comprising the electrically conductive material 30, the integrated circuit die 60, the substrate and the plastic moulding compound. After curing the panel, the panel may be released from the substrate. After releasing the panel from the substrate, a batch lithography process may be used to form the first electrically isolating layer 24 at the opposite first side 1. The integrated antenna structure 42 may then be formed by deposition of a patterned copper metallization layer on the first electrically isolating layer 24. Electroplating techniques may be used for the deposition of the patterned copper metallization layer. After the integrated antenna structure 42 is formed, the second electrically isolating layer 28 may be formed on the first electrically isolating layer 24 such that the integrated antenna structure 42 is sandwiched between the first electrically isolating layer 24 and the second electrically isolating layer 28.

Alternatively, with reference to FIG. 7, if the electrically conductive material 31 is sandwiched between the third and the fourth electrically isolating layers 22a and 23a, the panel obtained after encapsulation with the dielectric material 25 may include the integrated circuit die 60, the substrate and the dielectric material 25.

The integrated circuit package 50, 52, 54, 56, 57, 58, 58a or 59 described with reference to the FIGS. 1-11 may be manufactured using a technology referred as redistributed circuit chip package (RCP) manufactured as for example disclosed in Keser B. at al., "The Redistributed Chip Package: A Breakthrough for Advanced Packaging", *Electronic Components and Technology Conference*, 2007 Proceedings. $57^{th}$, pp. 286-291, 2007, incorporated herein by reference.

The RCP technology allows to route signals within the electrically isolating layers 24 and 28, 22 and 23 or 22a and 23a, to for example electrically connect the electrically conductive material 30, 31, 34 or 36 to the ground connection of the integrated circuit die 60 or 62. The electrically conductive material 30, 31, 34 or 36 can be electrically connected to the integrated circuit die 60 or 62 and be used both as a ground plane and as a radio frequency reflector. Furthermore, compared to for example U.S. Pat. No. 8,169, 060 B2, the electrically conductive material 30, 31, 34 or 36 may be encapsulated in the dielectric material 25 of the package. Since the electrically conductive material 30, 31, 34 or 36 can placed inside the package and be electrically connected to for example the integrated circuit dies 60 or 62, the electrically conductive material 30, 31, 34 or 36 may additionally be used as an internal heat sink electrically connected to the ground.

In the foregoing specification, the invention has been described with reference to specific examples of embodiments of the invention. It will, however, be evident that various modifications and changes may be made therein without departing from the scope of the invention as set forth in the appended claims. For example, the electrical connections may be any type of electrical connection suitable to transfer signals from or to the respective nodes, units or devices, for example via intermediate devices. Accordingly, unless implied or stated otherwise the connections may for example be direct connections or indirect connections. For example the integrated circuit packages 58, 59 described with reference to the FIGS. 9-10 are mounted on the respective PCB 90 or 91 solder balls 110 and 11. However, other type of connections may electrically connect the packages 58 and 59 to the respective PCBs 90 or 91, e.g. conductive epoxy or bondwires.

Also, devices functionally forming separate devices may be integrated in a single physical device. For example, as shown through the FIGS. 9 and 10, a single integrated circuits die 60, 62 may integrate a transmitter and a receiver. However, the transmitter and the receiver may be integrated in separate integrated circuit dies both electrically coupled to the respective integrated antenna structures. The separate integrated circuit dies may be electrically coupled to the respective first and second integrated antenna structures 43 and 44 for transmitting and/or receiving the respective first and second RF signals in the respective first and second predetermined frequency bands.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency device comprising:
   an integrated circuit package comprising a radio frequency coupling arrangement arranged inside the integrated circuit package, the radio frequency coupling arrangement comprising:
      a first stack comprising at least a first electrically isolating layer and a second electrically isolating layer, the first stack being arranged at a first side of the integrated circuit package;
      an electrically conductive material arranged at a second side of the integrated circuit package opposite to the first side;
      a dielectric material interposed between the first stack and the electrically conductive material;
      an integrated antenna structure for at least one of transmitting and receiving a radio frequency signal arranged between the first electrically isolating layer and the second electrically isolating layer; and
      the electrically conductive material being arranged to partly overlap the integrated antenna structure and being separated from the integrated antenna structure by at least the first electrically isolating layer and the dielectric material, the electrically conductive material being arranged to reflect the radio frequency signal received by the electrically conductive material through at least the dielectric material and the first electrically isolating layer to the first side, wherein the first stack, the electrically conductive material, the dielectric material, and the integrated antenna structure are entirely integrated into the integrated circuit package; and
   a printed circuit board (PCB), the integrated circuit package being mounted on the PCB at the first side of the integrated circuit package, wherein the PCB has a radio frequency waveguide formed therein via a hole extending through the entire thickness of the PCB, the hole having lateral walls covered by an electrically conductive layer, the hole extending to an area of the radio frequency coupling arrangement partly overlapping the integrated antenna structure, and wherein the integrated circuit package is electrically coupled to the radio frequency waveguide and the radio frequency waveguide is configured to guide the radio frequency signal out of a plane parallel to a surface of the first electrically isolating layer.

2. An integrated circuit package according to claim 1, the integrated circuit package further comprising a second stack comprising at least a third electrically isolating layer and a fourth electrically isolating layer arranged at a second side of the integrated circuit package, the second stack being separated from the first stack by at least the dielectric material, the electrically conductive material being arranged on a face of the second stack opposite to the second side and being encapsulated by the dielectric material.

3. An integrated circuit package according to claim 1, the integrated circuit package further comprising a second stack comprising at least a third electrically isolating layer and a fourth electrically isolating layer arranged at a second side of the integrated circuit package, the second stack being separated from the first stack by at least the dielectric material, the electrically conductive material being arranged between the third electrically isolating layer and the fourth electrically isolating layer, and being separated from the integrated antenna structure by at least the fourth electrically isolating layer, the dielectric material and the first electrically isolating layer.

4. An integrated circuit package according to claim 3, the integrated antenna structure being electrically coupled to an integrated circuit die via one or more electrically conductive vias extending through at least the fourth electrically isolating layer, the dielectric material and the first electrically isolating layer, the integrated circuit die being arranged to at least one of to generate the radio frequency signal for transmission via the integrated antenna structure and to receive the radio frequency signal as received via the integrated antenna structure.

5. An integrated circuit package according to claim 4, the integrated circuit die being arranged inside the integrated circuit package and having a surface in direct contact with a face of the second stack opposite to the second side.

6. An integrated circuit package according to claim 4, the integrated circuit die comprising a circuit of the group of circuits consisting of: a transmitter, a receiver, and a transceiver, the circuit being electrically coupled to the integrated antenna structure.

7. An integrated circuit package according to claim 1, the integrated antenna structure being surrounded by electrically conductive vias, the electrically conductive vias extending through at least the first electrically isolating layer and the dielectric material, the electrically conductive vias being electrically connected to the electrically conductive material.

8. An integrated circuit package according to claim 1, the electrically conductive material being electrically connected to a reference potential.

9. An integrated circuit package according to claim 1, the integrated antenna structure being an integrated planar antenna of one of the group consisting of: a single-ended microstrip antenna, a differential microstrip antenna, a rectangular patched single-ended antenna, a rectangular patched differential antenna, a square patched single-ended antenna, a square patched differential antenna.

10. An integrated circuit package as claimed in claim 1, the integrated antenna structure being arranged for at least one of transmitting and receiving a first radio frequency signal in a first predetermined frequency band; the integrated circuit package further comprising:
a second radio frequency coupling arrangement being arranged inside the integrated circuit package, and comprising:
a second electrically conductive material arranged inside the integrated circuit package at the second side,
a second integrated antenna structure arranged inside the first stack for at least one of transmitting and receiving a second radio frequency signal in a second predetermined frequency band,
the second electrically conductive material being arranged to partly overlap the second integrated antenna structure and being separated from the second integrated antenna structure by at least the first electrically isolating layer and the dielectric material, the second electrical conductive material being arranged to reflect the second radio frequency signal received by the second electrically conductive material through at least the dielectric material and the first electrically isolating layer to the first side.

11. An integrated circuit package according to claim 10, wherein the integrated circuit package further comprises a second stack comprising at least a third electrically isolating layer and a fourth electrically isolating layer arranged at a second side of the integrated circuit package, the second stack being separated from the first stack by at least the dielectric material, the electrically conductive material being arranged on a face of the second stack opposite to the second side and being encapsulated by the dielectric material; and
the second electrically conductive material being arranged on the face of the second stack opposite to the second side, the second electrically conductive material being encapsulated by the dielectric material.

12. A radio frequency device according to claim 11, wherein
the integrated antenna structure is electrically coupled to an integrated circuit die via one or more electrically conductive vias extending through at least the fourth electrically isolating layer, the dielectric material and the first electrically isolating layer, the integrated circuit die being arranged to generate the radio frequency signal for transmission via the integrated antenna structure and/or to receive the radio frequency signal as received via the integrated antenna structure, and
the device further comprises a second radio frequency waveguide extending through the entire thickness of the PCB and located at a second area at the first side of the integrated circuit package adjacent to the second integrated antenna structure, the integrated circuit package being electrically coupled to the second radio frequency waveguide and the second radio frequency waveguide is configured to guide the second radio frequency signal out of the plane parallel to the surface.

13. A radio frequency device according to claim 12, wherein the second radio frequency waveguide is formed in the printed circuit board via a second hole extending through the printed circuit board, the second hole having second lateral walls covered by a second electrically conductive layer, the second hole extending to an area of the second radio frequency coupling arrangement partly overlapping the second integrated antenna structure.

14. An integrated circuit package according to claim 10, the second integrated antenna structure being surrounded by second electrical conductive vias, the second electrically conductive vias extending through at least the first insulating layer, the dielectric material and being electrically connected to the second electrical conductive material.

15. An integrated circuit package according to claim 10, and wherein
the integrated antenna structure being electrically coupled to an integrated circuit die via one or more electrically conductive vias extending through at least the fourth electrically isolating layer, the dielectric material and the first electrically isolating layer, the integrated circuit die being arranged to generate the radio frequency signal for transmission via the integrated antenna structure and/or to receive the radio frequency signal as received via the integrated antenna structure; and
the second integrated antenna structure being electrically coupled to the integrated circuit die via second one or more electrically conductive vias through at least the fourth insulating layer, the first dielectric material and the first electrically isolating layer, the integrated circuit die being arranged to at least one of to generate the second radio frequency signal via the second integrated antenna structure and to receive the second radio frequency signal via the second integrated antenna structure.

16. A radio frequency device according to claim 1, further comprising a second integrated circuit package or a heat sink structure, the second integrated circuit package or the heat sink structure being mounted on the integrated circuit package at the second side via a second plurality of solder balls.

17. A radar sensor for detecting targets in a field of view comprising the integrated circuit package according to claim 1, the radar sensor further comprising:
an antenna electrically coupled to the radio frequency wave guide for transmitting the radio frequency signal through a frequency channel.

18. A method of manufacturing an integrated circuit package, the integrated circuit package having a first side and a second side opposite to the first side, the method comprising:
providing an electrically conductive material inside the integrated circuit package at the second side;
providing a dielectric material on at least the electrically conductive material, the dielectric material encapsulating the electrically conductive material;
providing a first electrically isolating layer at the first side on at least the dielectric material such that the dielectric material is interposed between the electrically conductive material and the first electrically isolating layer;
providing an integrated antenna structure on at least the first electrically isolating layer,
stacking a second electrically isolating layer on at least the first electrically isolating layer and on the integrated antenna structure;
arranging the electrically conductive material such to partly overlap the integrated antenna structure and to reflect the radio frequency signal received by the electrically conductive material through at least the first electrically isolating layer and the dielectric material to the first side, wherein the electrically conductive material, the dielectric material, the integrated antenna structure, and the first and second electrically isolating layers are entirely integrated into the integrated circuit package; and
mounting the integrated circuit package on a printed circuit board (PCB), the integrated circuit package being mounted on the PCB at the first side of the integrated circuit package, wherein the PCB has a radio frequency waveguide formed therein via a hole extending through the entire thickness of the PCB, the hole having lateral walls covered by an electrically conductive layer, the hole extending to an area of the radio frequency coupling arrangement partly overlapping the integrated antenna structure, and wherein the mounting operation electrically couples the integrated circuit package to the radio frequency waveguide and the radio frequency waveguide is configured to guide the radio frequency signal out of a plane parallel to a surface of the first electrically isolating layer.

* * * * *